(12) United States Patent
Bijnen et al.

(10) Patent No.: US 11,442,372 B2
(45) Date of Patent: Sep. 13, 2022

(54) METHOD OF MEASURING AN ALIGNMENT MARK OR AN ALIGNMENT MARK ASSEMBLY, ALIGNMENT SYSTEM, AND LITHOGRAPHIC TOOL

(71) Applicant: ASML Netherlands B.V., Veldhoven (NL)

(72) Inventors: Franciscus Godefridus Casper Bijnen, Valkenswaard (NL); Ralph Brinkhof, Vught (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/442,951

(22) PCT Filed: Feb. 25, 2020

(86) PCT No.: PCT/EP2020/054835
§ 371 (c)(1),
(2) Date: Sep. 24, 2021

(87) PCT Pub. No.: WO2020/193039
PCT Pub. Date: Oct. 1, 2020

(65) Prior Publication Data
US 2022/0187722 A1    Jun. 16, 2022

(30) Foreign Application Priority Data
Mar. 27, 2019   (EP) .................................... 19165581

(51) Int. Cl.
*G03F 9/00*        (2006.01)
(52) U.S. Cl.
CPC .................. *G03F 9/7088* (2013.01)
(58) Field of Classification Search
CPC ..... G03F 9/7088; G03F 9/7076; G03F 9/7046
See application file for complete search history.

(56) References Cited

U.S. PATENT DOCUMENTS

| | | |
|---|---|---|
| 6,020,964 A | 2/2000 | Loopstra et al. |
| 6,952,253 B2 | 10/2005 | Lof et al. |

(Continued)

FOREIGN PATENT DOCUMENTS

| | | | |
|---|---|---|---|
| EP | 1434103 A2 * | 6/2004 | ........... G03F 9/7003 |
| EP | 2131243 A2 | 12/2009 | |
| EP | 2131243 A3 | 4/2012 | |

OTHER PUBLICATIONS

Alignment mark for a lithographic exposure tool, Research Disclosure, Kenneth Publications, Hampshire, UK, vol. 633, No. 29, Jan. 1, 2017 (Jan. 1, 2017), XP007145366, ISSN: 0374-4353; 3 pages.

(Continued)

*Primary Examiner* — Peter B Kim
(74) *Attorney, Agent, or Firm* — Sterne, Kessler, Goldstein & Fox P.L.L.C.

(57) ABSTRACT

The invention provides a method of measuring an alignment mark or an alignment mark assembly, wherein the alignment mark comprises grid features extending in at least two directions, the method comprising: measuring the alignment mark or alignment mark assembly using an expected location of the alignment mark or alignment mark assembly, determining a first position of the alignment mark or alignment mark assembly in a first direction, determining a second position of the alignment mark or alignment mark assembly in a second direction, wherein the second direction is perpendicular to the first direction, determining a second direction scan offset between the expected location of the alignment mark or alignment mark assembly in the second direction and the determined second position, and correcting the first position on the basis of the second direction scan offset using at least one correction data set to provide a first corrected position.

21 Claims, 7 Drawing Sheets

(56) References Cited

U.S. PATENT DOCUMENTS

2007/0002298 A1    1/2007  Visser
2007/0058173 A1    3/2007  Holzapfel
2018/0329307 A1   11/2018  Brinkhof et al.

OTHER PUBLICATIONS

International Search Report and Written Opinion of the International Searching Authority directed to related International Patent Application No. PCT/EP2020/054835, dated Jun. 2, 2020; 9 pages.
International Preliminary Report on Patentability directed to related International Patent Application No. PCT/EP2020/054835, dated Sep. 28, 2021; 7 pages.

* cited by examiner

METHOD OF MEASURING AN ALIGNMENT MARK OR AN ALIGNMENT MARK ASSEMBLY, ALIGNMENT SYSTEM, AND LITHOGRAPHIC TOOL

CROSS-REFERENCE TO RELATED APPLICATION

This application claims priority of EP application 19165581.0 which was filed on Mar. 27, 2019 and which is incorporated herein in its entirety by reference.

FIELD

The present invention relates to a method of measuring an alignment mark or an alignment mark assembly, an alignment system to measure an alignment mark or an alignment mark assembly and a lithographic tool comprising such alignment system.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

Alignment marks are used to determine a position of specific features, such as target portions, on a substrate. Due to wafer deformation, the accuracy of the position of the specific features, such as target portions, may not be determined with sufficient accuracy on the basis of the positions of a few alignment marks. Therefore, multiple alignment marks may be provided on the substrate. The alignment marks may be arranged close to the target portions. The alignment marks may include coarse alignment marks and fine alignment marks. The coarse alignment marks are used to determine an expected location of the fine alignment marks. This expected location of the fine alignment marks as determined by measurement of the coarse alignment marks may be used as a basis to measure the fine alignment marks, for example by scanning the fine alignment marks with a measurement beam of an alignment system.

With increasing demands on accuracy, there is a need to use fine alignment marks that are relatively small, to minimize the area needed for the fine alignment marks. These small alignment marks are for example advantageous when the alignment marks are used for intra-field alignment, which requires multiple fine alignment marks arranged in the target portions.

A drawback of smaller fine alignment marks is that they may become overfilled, i.e. the spot size of the measurement beam of the alignment system is large compared with the size of the alignment mark, such that the spot also covers surrounding structures of the fine alignment marks. The scanning of the surrounding structures during measurement of the fine alignment marks may have a negative effect on the accuracy of the measurement of the position of the alignment mark.

It may also be desirable to use alignment marks that have an internal structure with subareas with different grid line features extending in at least two directions. These alignment marks having an internal structure may allow a more accurate determination of the position of the respective alignment mark. A drawback of alignment marks having internal structures is however that they, as a result of the use of internal structures, may be more sensitive for the location of the scanning path of the spot of the measurement beam over the alignment mark.

SUMMARY

It is an object of the invention to provide a method of measuring an alignment mark or an alignment mark assembly that may improve the accuracy of position measurement of such alignment mark or alignment mark assembly, for example the accuracy of measurement of relatively small potentially overfilled alignment marks or alignment marks having an internal structure.

According to a first aspect of the invention, there is provided a method of measuring an alignment mark or an alignment mark assembly, wherein the alignment mark or alignment mark assembly comprises grid features extending in at least two directions, the method comprising:

measuring the alignment mark or alignment mark assembly based on an expected location of the alignment mark or alignment mark assembly, determining a first position of the alignment mark or alignment mark assembly in a first direction, determining a second position of the alignment mark or alignment mark assembly in a second direction, determining a second direction scan offset between the expected location of the alignment mark or alignment mark assembly in the second direction and the determined second position, and correcting the first position on the basis of the second direction scan offset using at least one correction data set to provide a first corrected position.

In one embodiment, the method further comprises the steps of:

determining a first direction scan offset between the expected location of the alignment mark or alignment mark assembly in the first direction and the determined first position, correcting the second position on the basis of the first direction scan offset using the at least one correction data set to provide a second corrected position. Advantageously, this embodiment allows reducing the error of the measurement in a second direction. Therefore, this embodiment allows correcting errors in two different directions, increasing the performance of the method.

In this embodiment, the order of the correction of the first and second position may be performed in any sequence. In a particular embodiment, it is firstly corrected the first position. In other particular embodiment, it is firstly corrected the second position. In another particular embodiment, the first and second positions are corrected simultaneously.

In one embodiment, the at least one correction data set comprises at least one correction map. In other embodiment, the at least one correction data set comprises a first correction map for correcting the first position on the basis of the second direction scan offset and a second correction map for correcting the second position on the basis of the first direction scan offset. In an additional embodiment, the at least one correction data set comprises a two-dimensional correction map for correcting the first position and the second position simultaneously on the basis of the first direction scan offset and the second direction scan offset.

Advantageously, the above embodiments further improve the accuracy of the measurement of the alignment mark.

In a further embodiment, the at least one correction data set comprises a two-dimensional correction map for correcting at least one of the first and second positions on the basis of the first direction scan offset and the second direction scan offset.

Advantageously, this embodiment allows to a user choosing only one direction which may be critical for overlay, employing the high accuracy provided by the scan offsets of both directions.

In one embodiment, the first direction is perpendicular to the second direction. Advantageously, this embodiment increases the effectiveness of the method when any of the alignment marks comprises at least one set of perpendicular pitches.

In one embodiment, the step of measuring the alignment mark comprises scanning the alignment mark in a scanning direction, the scanning direction having a non-zero component in the first direction and a non-zero component in the second direction. Advantageously, this embodiment allows detecting both directions simultaneously. Therefore, when this embodiment is performed in an alignment system or in a lithographic tool, the throughput advantageously increases.

In other embodiment, the step of measuring the alignment mark comprises scanning in a first measurement scan the alignment mark in a first scanning direction parallel to the first direction and scanning in a second measurement scan the alignment mark in a second scanning direction parallel to the second direction.

In one embodiment, the alignment mark comprises overlapping grid features in the first direction and the second direction. In other embodiment, the alignment mark is an alignment mark having an internal structure having subareas with different grid line features extending in at least two directions. In a further embodiment, the alignment mark assembly comprises a first alignment mark having grid lines extending in the first direction and a second alignment mark having grid lines extending in the second direction, wherein the first alignment mark and the second alignment mark are adjacent to each other. In more particular embodiment, the alignment mark or alignment mark assembly is an intra-field alignment mark or an intra-field alignment mark assembly Advantageously, these embodiments are able to increase the accuracy of the detection of different type of alignment marks.

In one embodiment, the at least one correction data set is obtained by calibration measurements of the alignment mark or the alignment mark assembly. In a further embodiment, the calibration measurements are performed to correct for effects of surrounding structures of the alignment mark or the alignment mark assembly. In other embodiment, the calibration measurements are performed to correct for effects of internal structures of the alignment mark or the alignment mark assembly. In another embodiment, the calibration measurements are performed to correct for effects of intensity profiles of a measurement beam. Advantageously, these embodiments are able to correct derived from internal and/or external structures of the mark and/or the profiles of the measurement beam.

In an embodiment, the method further comprises the step of correcting the first corrected position on the basis of the second corrected position to provide a first further corrected position and correcting the second corrected position on the basis of the first corrected position to provide a second further corrected position using at least one correction data set. In a more particular embodiment, the method further comprises repeating the step of correcting the first corrected position and the second corrected position to improve accuracy of the first further corrected position and the second further corrected position. Advantageously, these embodiments further increase the accuracy of the method of the invention.

In an embodiment, the method of the invention comprises before the step of measuring the alignment mark or the alignment mark assembly determining the expected location of the alignment mark or the alignment mark assembly. Advantageously, this embodiment further increases the accuracy and the efficiency of the method of the invention.

According to a second aspect of the invention, there is provided a method for determining at least one intra field model on a substrate comprising, performing the method of any of the embodiments of the first aspect of the invention for each alignment mark or alignment mark assembly located on said substrate, and determining said at least one intra-field model based on the measured alignment mark or alignment mark assembly.

According to a third aspect of the invention, there is provided an alignment system to measure an alignment mark or an alignment mark assembly, the alignment system comprising:

an alignment sensor system arranged to measure the alignment mark or alignment mark assembly based on an expected location of the alignment mark or alignment mark assembly, and a processing unit configured to:
determine a first position of the alignment mark or alignment mark assembly in a first direction,
determine a second position of the alignment mark or alignment mark assembly in a second direction,
determine a second direction scan offset between the expected location of the alignment mark or alignment mark assembly in the second direction and the determined second position, and
correct the first position on the basis of the second direction scan offset using at least one correction data set to provide a first corrected position.

In one embodiment, the processing unit is configured to:
determine a first direction scan offset between the expected location of the alignment mark or alignment mark assembly in the first direction and the determined first position, and
correct the second position on the basis of the first direction scan offset using at least one correction data set to provide a second corrected position.

Advantageously, this embodiment allows reducing the error of the measurement in a second direction. Therefore, the alignment system allows correcting errors in two different directions, increasing the accuracy of the measurement.

In one embodiment, the alignment sensor system provides a measurement beam having a spot size on the alignment mark or alignment mark assembly, wherein the spot size of the measurement beam is larger than a smallest cross dimension of the alignment mark or a smallest cross dimension of an alignment mark of the alignment mark assembly.

In a further embodiment, the processing unit configured to perform any of the steps described in any of the embodiments of the first aspect of the invention.

According to a fourth aspect of the invention, there is provided a lithographic tool comprising an alignment system to measure an alignment mark or an alignment mark assembly, the alignment system comprising:

an alignment sensor system arranged to measure the alignment mark or alignment mark assembly based on an expected location of the alignment mark or alignment mark assembly, and a processing unit configured to:
determine a first position of the alignment mark or alignment mark assembly in a first direction,
determine a second position of the alignment mark or alignment mark assembly in a second direction,
determine a second direction scan offset between the expected location of the alignment mark or alignment mark assembly in the second direction and the determined second position, and
correct the first position on the basis of the second direction scan offset using at least one correction data set to provide a first corrected position.

In one embodiment, the lithography tool comprises the alignment system of any the embodiments of the third aspect of the invention.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
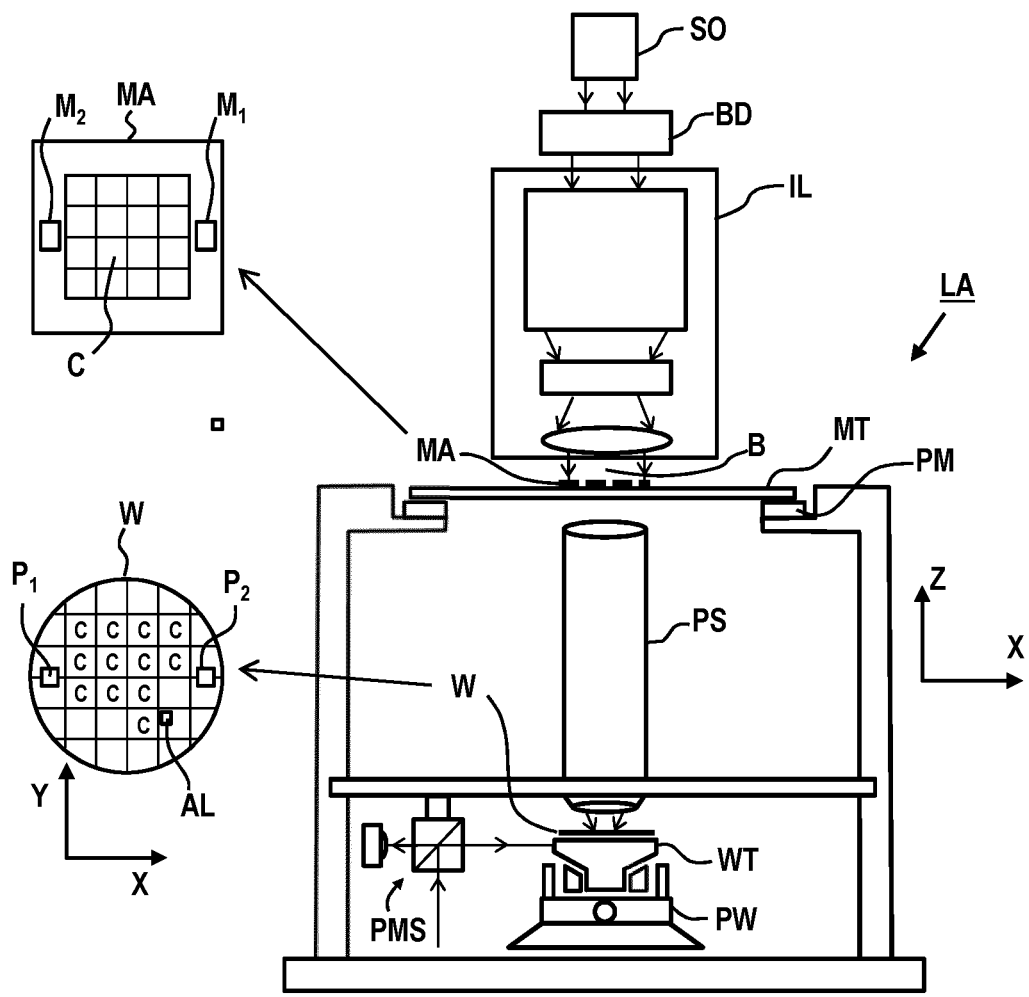
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT. The mask support MT is constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system PMS, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. The substrate alignment marks P1, P2 may be used as coarse alignment marks, i.e. alignment marks that are used to determine an expected location of other parts of the substrate, such as an expected location of (fine) alignment marks. Further, fine alignment marks AL may be provided to determine the position of specific locations of the substrate, whereby the expected location of the fine alignment marks AL as determined by measurement of the coarse alignment marks P1, P2 is used as basis for measurement of the fine alignment marks AL.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
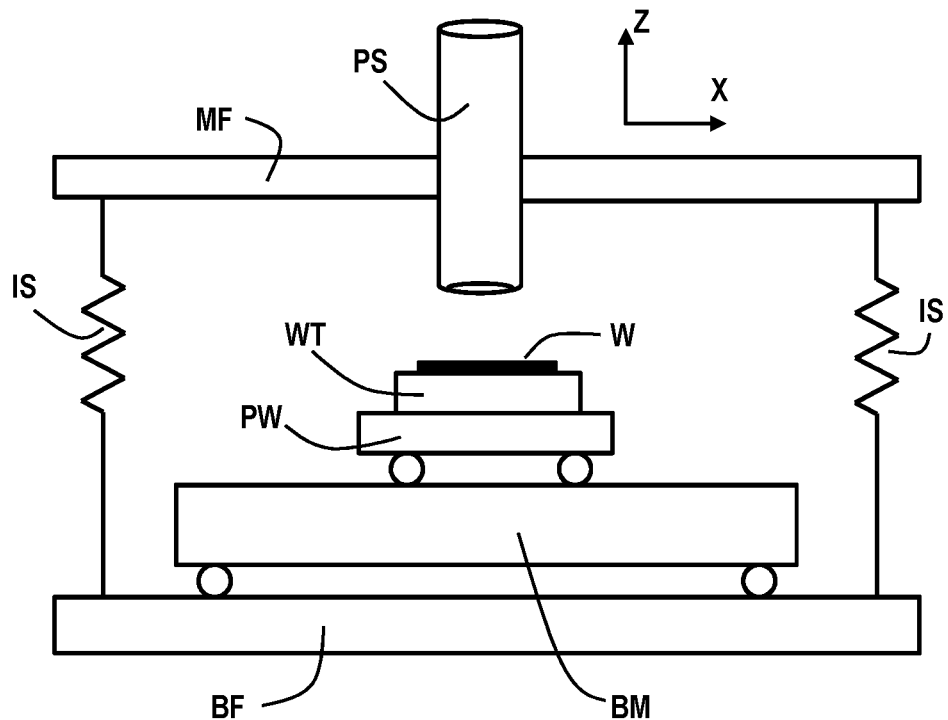
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor. a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, United States patent U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
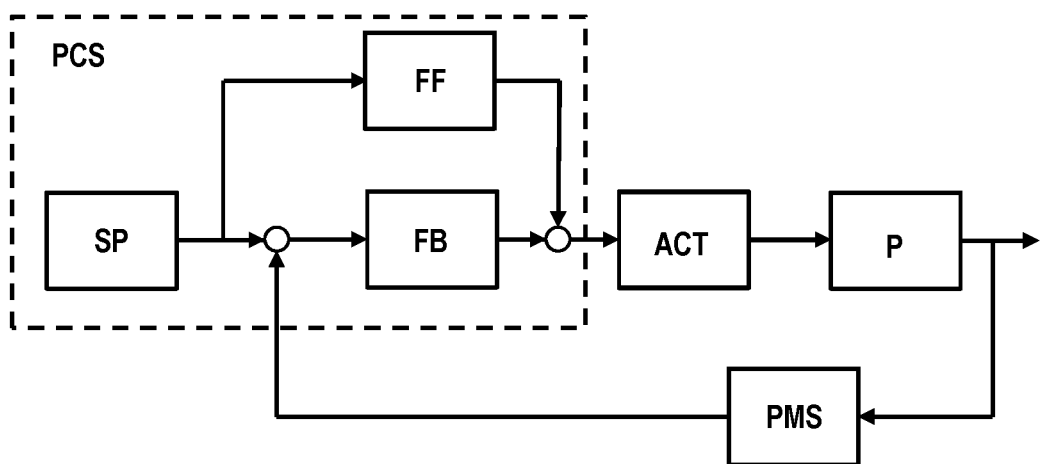
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

Figure 4:
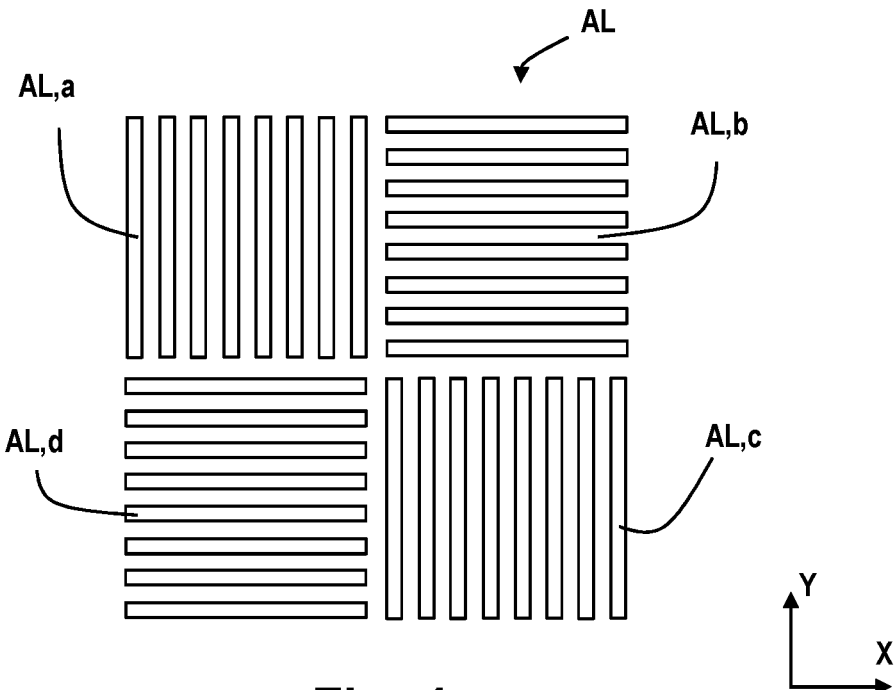
FIG. 4 depicts an alignment mark having internal structures.

A first embodiment of an alignment mark AL as depicted in FIG. 1 is shown in more detail in FIG. 4. The alignment mark AL is a phase grating having a 2×2 array of sub-gratings AL,a, AL,b, AL,c and AL,d, wherein a first two sub-gratings, AL,a and AL,c, serve for alignment in the x-direction and a second two sub-gratings, AL,b and AL,d, serve for alignment in the y-direction. The first two sub-gratings AL,b and AL,c may have a first grating period, where the second two sub-gratings AL,a and AL,d may have a second grating period different than the first grating period.

A substrate may be provided with coarse alignment marks P1, P2 to measure a position of the alignment marks P1, P2. This position of the coarse alignment marks P1, P2 may be used to determine an expected location on the substrate where the alignment mark AL is located. In some embodiments this step in which coarse alignment marks P1, P2 are used to determine an expected location of other alignment marks, is indicated as coarse wafer alignment (COWA). In a next step the alignment mark AL, and other alignment marks, may be measured by the alignment sensor system AS, whereby the expected location of the alignment mark AL determined on the basis of the position of the coarse alignment marks P1, P2 is used as a basis to scan the alignment mark AL. In some embodiments, this step is indicated as fine wafer alignment (FIWA).

Figure 5:
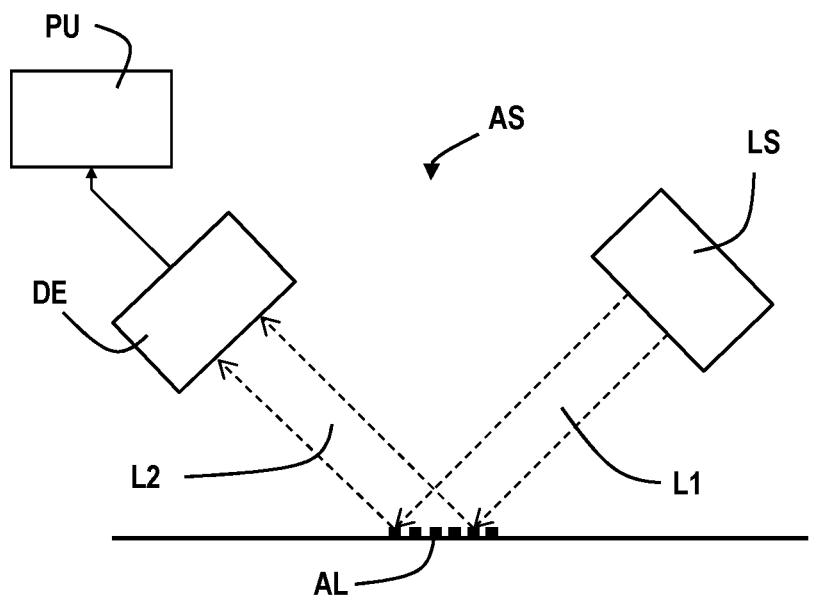
FIG. 5 depicts an alignment system to measure alignment marks.

The position of the substrate alignment mark AL may be measured using an alignment system with alignment sensor system AS, as shown in FIG. 5. The alignment sensor system AS comprises a light source LS that emits light L1 towards an alignment mark AL. Due to the gratings of the alignment mark the reflected light L2 is diffracted. The diffraction pattern in the reflected light is measured using an appropriate detector DE. From the diffraction pattern, the position of the alignment mark may be derived by a processing unit PU.

The alignment sensor system AS may be provided with multiple light sources which may share the common processing unit PU. The multiple light sources are advantageous, because the signal strength of monochromatic light reflected from a phase grating varies periodically with the depth of the grooves of the gratings. Processing of the wafer may influence the depth of the grooves which can render grating marks undetectable in some cases or provide a weak signal in other cases when using a monochromatic alignment sensor. By providing multiple light sources each emitting light at a separate wavelength, chances are improved that at least one of the measuring wavelengths provides a sufficient signal strength that can be used for alignment position determination. Alignment systems may for example use two or four measuring wavelengths all sharing the same processing unit which processes the signals coming from the respective detectors. However, other numbers of measuring wavelengths are also envisaged. It is further noted that using the multiple measuring wavelengths in practice may be implemented in different ways. Multiple separate sensors may be provided. Also, a single broadband light source may be used.

Due to the difference in sub-gratings in the alignment mark AL shown in FIG. 4, the alignment mark AL is an alignment mark having an internal structure having subareas with different grid line features extending in at least two directions, i.e. the first two sub-gratings AL,a and AL,c have different grid line features than the grid line features of the second two sub-gratings AL,b and AL,d. In the shown embodiment the grid line features of the first two sub-gratings AL,a and AL,c are provided to determine a position in x-direction, while the grid line features of the second two sub-gratings AL,b and AL,d are provided to determine a position in y-direction. The grid line features of the first two sub-gratings AL,a and AL,c and the second two sub-gratings AL,b and AL,d comprise grid lines arranged at a pitch with respect to each other. The pitch of the grid lines of the first two sub-gratings AL,a and AL,c may be the same as or different than the pitch of the grid lines of the second two sub-gratings AL,b and AL,d.

A drawback of this internal structure with different subareas, is that the internal structure may introduce an error in the measurement due to a scan offset during scanning of the alignment mark AL. For example, a scan offset in y-direction with respect to the center of the alignment mark AL in y-direction may result in an error in the measurement of the x-position of the alignment mark AL Similarly, a scan offset in x-direction with respect to the center of the alignment mark AL in x-direction may result in an error in the measurement of the y-position of the alignment mark AL.

A similar drawback may occur in measurement of alignment marks that are relatively small with respect to the cross dimension of the measurement beam L1 of the alignment sensor system AS. A small alignment mark or alignment mark assembly may for example be desirable for intra-field alignment marks or intra-field alignment mark assemblies to minimize the space that is required for placement of the alignment mark or alignment mark assembly on a substrate. In such embodiment a scan offset in y-direction and/or x-direction may result in that a part of the measurement beam L1 will scan surrounding structures of the alignment mark instead of the alignment mark itself, which may reduce the accuracy of the measurement of the position of the alignment mark. The size of this part of the measurement beam L1 that will measure surrounding structures will also be dependent on the magnitude of the scan offset in y-direction and/or x-direction of the measurement beam L1 with respect to a center line of the respective alignment mark.

Also, the intensity profile of the measurement beam L1 may have effect on the measurement accuracy in dependence of the scan offset in y-direction and/or x-direction. the intensity profile is for example dependent on the shape of the cross-section of the measurement beam L1 and/or the homogeneity of the measurement beam L1 over its cross-section.

A method is proposed to correct an error in a first direction resulting from a scan offset of the measurement beam L1 in a second direction by using at least one correction data set, for example by using a correction map that is calibrated for different scan offsets of the measurement beam L1 in the second direction. In alternative embodiments, other correction data sets may be used to correct an error of the determined position in a first direction on the basis of a determined position in a second direction, for example defining a relationship between an error in a first direction resulting from a scan offset of the measurement beam L1 in a second direction. These other correction data may include functional relationships, for example functional relationships fitted on experimental data, lookup tables, possibly in combination with interpolation calculations, etc.

The method comprises the steps of measuring the alignment mark AL based on an expected location of the alignment mark AL, determining a first position of the alignment mark in a first direction and determining a second position of the alignment mark in a second direction. Subsequently, a second direction scan offset between the expected location of the alignment mark AL in the second direction and the determined second position is determined. Finally, the first position is corrected on the basis of the second direction scan offset using at least one correction data set to provide a first corrected position. When desired, also the second position may be corrected on the basis of a determined first direction scan offset between the expected location of the alignment mark AL in the first direction and the determined first position, using at least one correction data set to provide a second corrected position. The alignment system shown in FIG. 5 is arranged to carry out this method.

Figure 6:
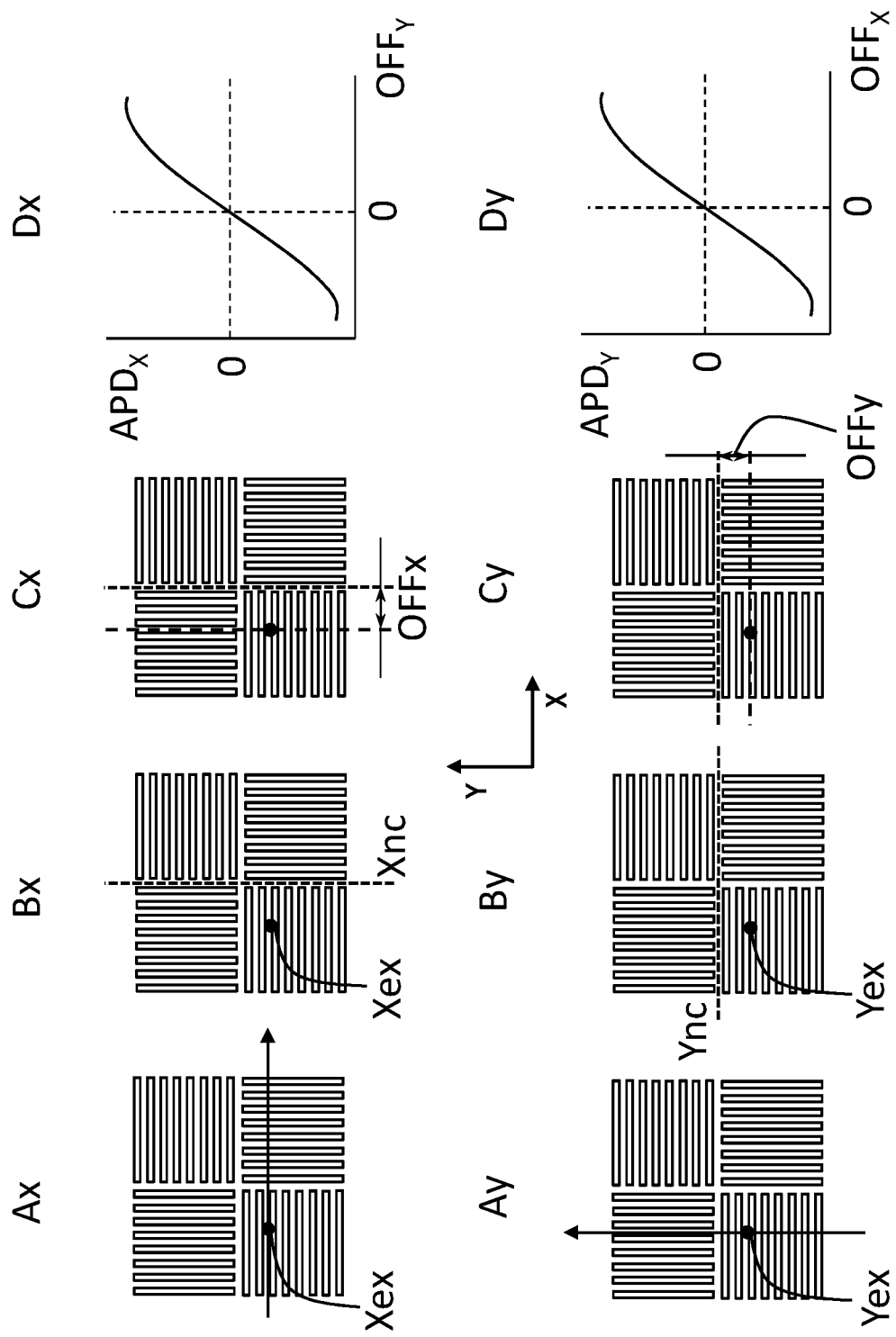
FIG. 6 depicts schematically the steps of a method according to an embodiment of the invention.

FIG. 6 shows the steps of the method for the alignment mark AL shown in FIG. 4 in more detail. To determine a corrected position of the alignment mark AL in x-direction and a corrected position of the alignment mark AL in y-direction, the upper row of FIG. 6 shows the steps Ax, Bx, Cx, Dx and the lower row of FIG. 6 shows the steps Ay, By, Cy, Dy.

As indicated above, on the basis of the measurement of the coarse alignment marks P1, P2, an expected position Xex of the alignment mark AL in x-direction and an expected position Yex of the alignment mark in y-direction may be calculated.

This expected x-position Xex and the expected y-position Yex of the alignment mark AL define an expected location of the alignment mark AL that is used as start position to scan the measurement beam L1 over the alignment mark AL in x-direction and y-direction, respectively.

In step Ax, the alignment mark AL is measured by the alignment sensor system AS by scanning the measurement beam L1 in a measurement scan in x-direction over the alignment mark AL. On the basis of the measurement results of this measurement scan in x-direction, a non-corrected x-position Xnc of the alignment mark AL may be calculated by the processing unit PU, as shown in the second step Bx.

In a third step Cx, an x-direction scan offset OFFx of the measurement scan in x-direction is calculated by the processing unit PU on the basis of the difference between the expected x-position Xex and the calculated non-corrected position Xnc.

In step Ay, the alignment mark AL is measured by the alignment sensor system AS by scanning the measurement beam L1 in a measurement scan in y-direction over the alignment mark AL. On the basis of the measurement results of this measurement scan in y-direction, a non-corrected position Ync of the alignment mark AL may be calculated by the processing unit PU, as indicated in the second step By. In a third step Cy, an y-direction scan offset Offy of the measurement scan in y-direction is calculated by the processing unit PU on the basis of the difference between the expected y-position Yex and the calculated non-corrected position Ync.

In a fourth step Dx, an x-correction map is used to correct the non-corrected x-position Xnc in x-direction on the basis of the y-direction scan offset OFFy calculated in step Cy. The x-correction map comprises a relationship between the y-direction scan offset OFFy and a correction APDx for a calculated non-corrected position Xnc. Thus, in step Dx, the non-corrected position Xnc is corrected using the x-correction map to determine a corrected position Xcor (not referenced in the figures) whereby the correction is based on the y-direction scan offset OFFy calculated in step Cy.

Correspondingly, in a fourth step Dy for calculation of a corrected y-position Ycor in y-direction, a y-correction map is used to correct the non-corrected y-position Ync on the basis of the x-direction scan offset OFFx calculated in step Cx. The y-correction map comprises a relationship between the x-direction scan offset OFFx and a correction APDy for a calculated non-corrected y-position Ync.

In practice, both the measurement steps Ax and Ay may be performed before any of the calculation steps Bx, Cx, Dx, By, Cy and Dy are performed. It is also possible to perform the calculation steps Bx and Cx before or during the measurement step Ay, or to perform the calculation steps By and Cy before or during the measurement step Ax. Step Dx can only be performed after calculation step Cy has been finished and step Dy can only be performed after calculation step Cx has been finished.

In this application, the term non-corrected position is used to indicate a position in which the correction as described in this application has not (yet) been applied, while the corrected position indicates a position in which this correction has been applied. Other corrections, not specifically described in this application, may be applied to both the non-corrected position and the corrected position.

The corrected position Xcor of the measurement of the alignment mark AL in x-direction may be described by the following equation:

$$Xcor = Xnc + APDx(OFFy), \text{ wherein:}$$

Xcor is the corrected x-position,
Xnc is the non-corrected position in x-direction of the alignment mark AL determined on the basis of measuring the alignment mark AL with the measurement scan based on the expected location of the alignment mark AL, and
APDx(OFFy) is a correction of the position in x-direction of the alignment mark AL on the basis of the calculated scan offset of the measurement scan in y-direction.

The corrected position Ycor of the measurement of the alignment mark AL in y-direction may be described by the following equation:

$$Ycor = Ync + APDy(OFFx), \text{ wherein:}$$

Ycor is the corrected y-position,
Ync is the non-corrected position in y-direction of the alignment mark AL determined on the basis of measuring the alignment mark AL with the measurement scan based on the expected location of the alignment mark AL, and
APDy(OFFx) is a correction of the position in y-direction of the alignment mark AL on the basis of the calculated scan offset of the measurement scan in x-direction.

It has been found that the accuracy of the determination of an alignment mark AL having an internal structure may substantially be improved by applying a correction for the scan offset in a direction non-parallel, for example perpendicular, to the direction in which the position of the alignment mark is determined. For example, the expected position Xex in x-direction on the basis of the measurement of the coarse alignment marks P1, P2 may have an accuracy of +/−200 nm, the non-corrected position Xnc in x-direction obtained by measurement of the alignment mark may have an accuracy of +/−1 nm. By applying the correction map to correct for errors resulting from the scan offset in y-direction between the measurement scan based on the expected y-position Yex and the non-corrected y-position Ync, the accuracy of the corrected position Xcor of the alignment mark may be improved to +/−0.1 nm.

In some embodiments, the accuracy of calculation of the position of the alignment mark AL in x-direction and y-direction may be further increased by applying further iteration steps in which the corrected position Xcor in x-direction is further corrected for scan offset in y-direction and in which the corrected position Ycor in y-direction is further corrected for scan offset in x-direction. No new measurement scans are required for applying these further iteration steps. An example of a n-iteration of the corrected position Xcor and Ycor according to these embodiments may be:

$$OFFx(n\text{-iteration}) = Xex - Xcor(n-1\text{ iteration})$$

$$Ycor(n\text{-iteration}) = Ync + APDy(OFFx(n\text{-iteration}))$$

$$OFFy(n\text{-iteration}) = Yex - Ycor(n-1\text{ iteration})$$

$$Xcor(n\text{-iteration}) = Xnc + APDy(OFFy(n\text{-iteration}))$$

Where n is bigger or equal than 2.

Figure 7:
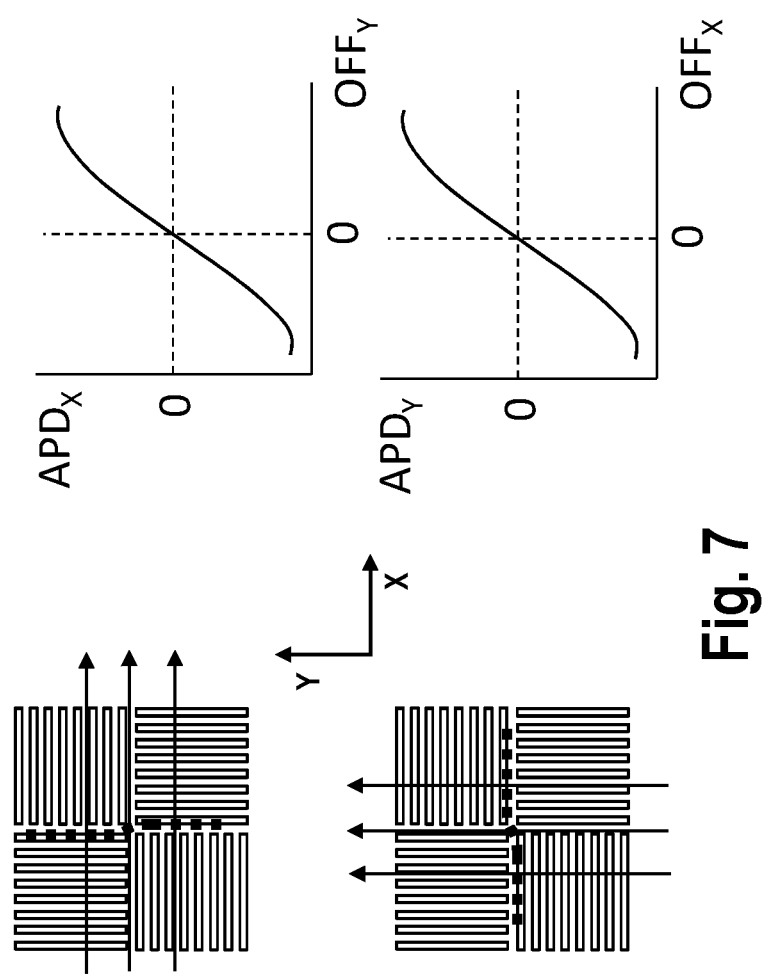
FIG. 7 depicts schematically the steps of a calibration method according to an embodiment of the invention.

FIG. 7 shows schematically the steps to create the x-correction map APDx(OFFy). Multiple scans in x-direction with different scan offsets in y-direction are performed with the alignments sensor system AS, and the resulting measurement data is collected. On the basis of the collected measurement data a relationship between the correction value APDx and the scan offset OFFy in y-direction may be fitted. Correspondingly, multiple scans in y-direction with different scan offsets in x-direction are performed using the alignment sensor system AS, and the resulting measurement data is collected. On the basis of this collected measurement data, a relationship between the correction value APDy and the scan offset OFFx in x-direction may be fitted.

In an embodiment, this calibration of the x-correction map and y-correction map should advantageously be made for each alignment mark for which correction on the basis of scan offset in a non-parallel direction, for example a direction perpendicular to the measurement direction is desired. For example, in order to use correction maps, the locations of alignment marks of at least one target portion of a first substrate of a first lot of a new layer should be calibrated. In practice, it is desirable that multiple alignment marks of the same layer, and possibly from different lots are calibrated to determine an appropriate correction data set.

Figure 8:
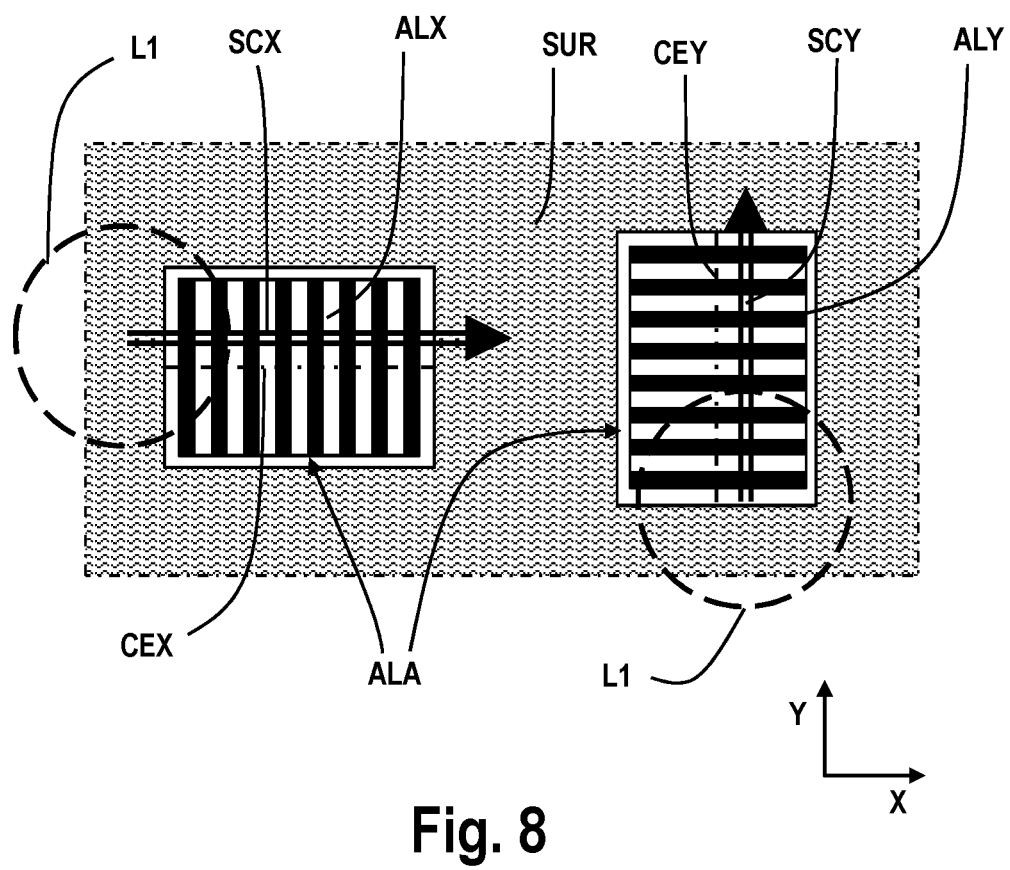
FIG. 8 depicts an alignment mark assembly.

FIG. 8 shows an alignment mark assembly ALA comprising a first unidirectional alignment mark ALX for measurement of an alignment position in x-direction and a second unidirectional alignment mark ALY for measurement of an alignment position in y-direction. An unidirectional alignment mark is an alignment mark having grid features, for example grid lines, extending in one direction to enable a position measurement in a single direction.

The first alignment mark ALX and the second alignment mark ALY are relatively small compared to a spot size of the measurement beam L1 of the alignment sensor system AS. As a result, a substantial part of the measurement beam L1 will scan over the surrounding structures SUR, when a measurement scan is carried out over the first alignment mark ALX and/or the second alignment mark ALY. Such relatively small alignment mark compared with the spot size of the measurement beam of the alignment sensor system may also be referred to as overfilled alignment mark.

The scanning of the surrounding structures SUR may have an effect on the results of the measurement. This effect will also depend on the scan offset of the measurement beam L1 in a direction perpendicular to the scanning direction of the measurement scan with respect to the center line of the alignment mark in this direction. For example, in a measurement scan SCX of the first alignment mark ALX, the measurement scan SCX may have a scan offset in y-direction with respect to the center line CEX of the first alignment mark ALX. Similarly, in a measurement scan SCY of the second alignment mark ALY, the measurement scan SCY may have a scan offset in x-direction with respect to the center line CEY of the second alignment mark ALY. This scan offset in x-direction and scan offset in y-direction will normally result from the determined expected locations of the first alignment mark ALX and the second alignment mark ALY on the basis of the coarse alignment marks P1, P2, as the coarse alignment marks P1, P2 can only provide an expected location of the first alignment mark ALX and the second alignment mark ALY.

Since the first alignment mark ALX and the second alignment mark ALX are relatively close to each other, the scan offset in x-direction measured with the first alignment mark ALX can advantageously be used for correction of the scan measurement SCY in the second alignment mark ALY, and the scan offset in y-direction measured with the second alignment mark ALY can advantageously be used for correction of the scan measurement SCX in the first alignment mark ALX.

In the calculation of the positions of the alignment marks ALX and ALY of the alignment mark assembly ALA, the same correction method as explained with respect to FIGS. 6 and 7 may be applied. When the effect of the scan offset in y-direction on the measurement of the position of the first alignment mark ALX in x-direction is known, for example by calibration and fitting in a first correction map, the effects of the scan offset in y-direction can be corrected by applying a correction of the non-corrected x-position calculated on the basis of the measurement scan SCX. As explained above, this correction will be based on the y-direction scan offset determined between the expected position in y-direction and the calculated non-corrected position in y-direction. Similarly, when the effect of the scan offset in x-direction on the calculation of the position of the second alignment mark ALY in y-direction is known, for example by calibration and fitting in a second correction map, the effects of the scan offset in y-direction can be corrected by applying a correction of the non-corrected y-position calculated on the basis of the measurement scan SCY. This correction will be based on the x-direction scan offset determined between the expected position in x-direction and the calculated non-corrected position in x-direction.

The application of corrections based on the first correction map and the second correction map will provide a corrected x-position of the first alignment mark ALX and a corrected y-position of the second alignment mark ALY. This may substantially increase the accuracy with which the positions of the overfilled first alignment mark ALX and second alignment mark ALY may be determined.

Figure 9:
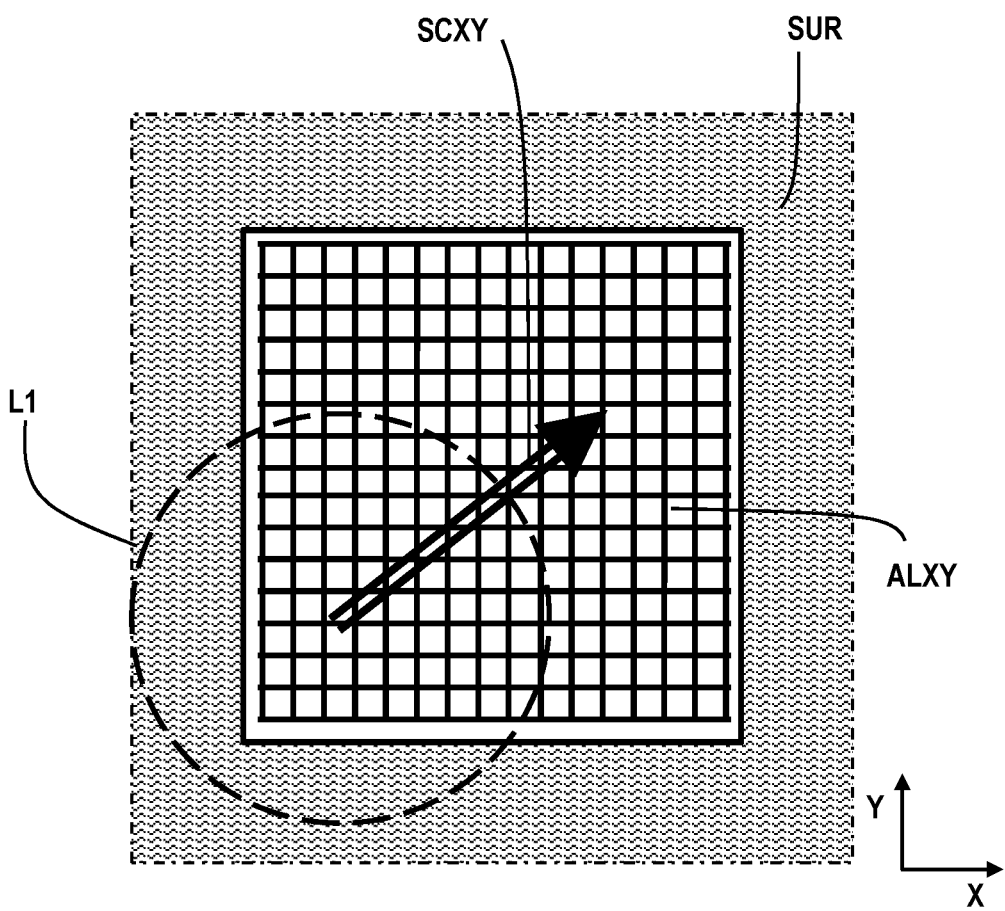
FIG. 9 depicts an embodiment of a two directional alignment mark.

FIG. 9 discloses another fine alignment mark ALXY that can advantageously be used in a method according to an embodiment of the invention.

The alignment mark ALXY comprises grid lines extending in the x-direction to determine a position of the alignment mark ALXY in the y-direction and grid lines extending in the y-direction to determine a position of the alignment mark ALXY in the x-direction.

The alignment mark ALXY is a fine alignment mark that is suitable to be scanned in an oblique scanning direction, i.e. a scanning direction having a non-zero component in the x-direction and a non-zero component in the y-direction. The scanning direction may for example be a direction at 45 degrees with the x-direction and 45 degrees with the y-direction. In this scanning direction, the pitch of the grid lines in x-direction should be different than the pitch of the grid lines in y-direction. In an alternative embodiment the scanning direction may be at an angle different than 45 degrees with respect to the x-direction and y-direction. In that case the pitch of the grid lines in the x-direction and the pitch of the grid lines in the y-direction may be the same.

By carrying out the measurement scan SCXY sufficient information can be obtained to determine a non-corrected x-position of the alignment mark ALXY in the x-direction and a non-corrected y-position of the alignment mark ALXY in the y-direction. The measurement scan SCXY is based on an expected location of the alignment mark ALXY. This expected location comprises an expected position in the x-direction and an expected position in the y-direction. The expected location of the alignment mark ALXY may be determined from measuring the locations of the coarse alignment marks P1, P2 of the substrate, and estimating the positions of the alignment mark ALXY on the basis of the determined locations of the coarse alignment marks P1, P2.

In the embodiment shown in FIG. 9, the spot size of the measurement beam L1 is relatively large compared with the dimensions of the alignment mark ALXY. As a result, measurements with the measurement beam L1 may be influenced by the surrounding structures SUR of the alignment mark ALXY. The effect of the surrounding structures SUR will also depend on the scan offset in the x-direction and the scan offset in the y-direction between a desired scanning path based on the actual location of the alignment mark ALXY and the actual scanning path of measurement scan SCXY which is based on the expected location of the alignment mark ALXY. In accordance with the method of the invention, the scan offset dependent effect of the surrounding structures SUR may be corrected by using a correction map.

Figure 10:
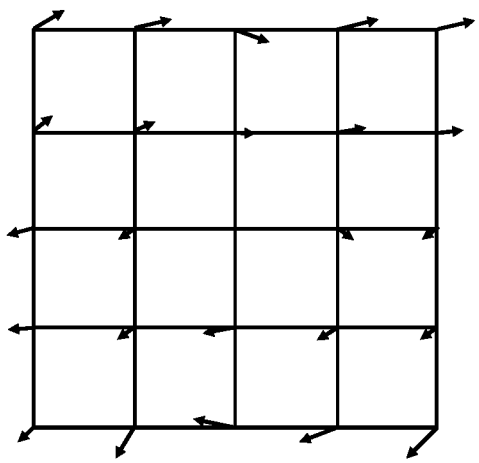
FIG. 10 shows a two-dimensional correction map according to an embodiment of the method of the invention.

FIG. 10 shows a two-dimensional correction map that can be used to correct for scan offset in the x-direction and/or y-direction of the measurement scan SCXY in order to more accurately calculate the position of the alignment mark ALXY in the y-direction and x-direction, respectively.

The two-dimensional correction map as shown in FIG. 10 is created by aligning with high precision to the alignment mark ALXY at defined scan offsets in x-direction and y-direction. The two-dimensional correction map can then be filled by comparing the selected scan offsets with the high precision alignment results. The two-dimensional correction map of FIG. 10 comprises five scan offset positions in both the x-direction and the y-direction which results in twenty five scan offset locations. For each of these two-dimensional scan offset locations, a correction value may be determined. The correction value for each scan offset location may for example be based on multiple measurements, for instance ten measurements for each scan offset location.

The two-dimensional correction map may for example be created for each location of an alignment mark ALXY within a field or target portion, and possibly for each location of an alignment mark ALXY on the complete substrate.

In an alternative embodiment, the correction map can be created by comparing the expected location of the coarse alignments and the non-corrected location calculated on the basis of the measurement scan SCXY of the alignment mark ALXY with overlay results at or close to the location of the alignment mark ALXY.

When the two-dimensional correction map is available, the non-corrected x-position and the non-corrected y-position calculated on the basis of the measurement scan SCXY can be corrected by applying the two-dimensional correction map. On the basis of the expected position in the x-direction and the calculated non-corrected x-position a scan offset in x-direction can be calculated. Correspondingly, on the basis of the expected position in the y-direction and the calculated coarse y-position a scan offset in y-direction can be calculated. This scan offset in x-direction and scan offset in y-direction are used to determine a correction using the two-dimensional correction map shown in FIG. 10. By applying this correction on the non-corrected x-position and the non-corrected y-position a corrected x-position and a corrected y-position may be calculated, respectively. It will be clear for the skilled person in the art that this corrected x-position and corrected y-position take into account the effects of the surrounding structures SUR as a function of the scan offset in the x-direction and the scan offset in the y-direction between the desired scanning path of the actual location of the alignment mark and the actual scanning path of the measurement scan based on the expected location of the alignment mark.

Hereinabove, a method is proposed to improve the accuracy in determination of the position of fine alignment marks. The method may advantageously be used for measuring fine alignment marks that are sensitive for scan offset between the desired scanning path based on the actual position of the alignment mark and the actual scanning path based on the expected location of the alignment mark.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus, such as a lithographic apparatus or a metrology apparatus, may be generally referred to as a lithographic tool. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method comprising:
   measuring an alignment mark or alignment mark assembly comprising grid features in at least two directions using an expected location of the alignment mark or alignment mark assembly,
   determining a first position of the alignment mark or alignment mark assembly in a first direction,
   determining a second position of the alignment mark or alignment mark assembly in a second direction,
   determining a second direction scan offset between the expected location of the alignment mark or alignment mark assembly in the second direction and the determined second position, and
   correcting the first position on the basis of the second direction scan offset using at least one correction data set to provide a first corrected position.

2. The method of claim 1, further comprising:
   determining a first direction scan offset between the expected location of the alignment mark or alignment mark assembly in the first direction and the determined first position; and
   correcting the second position on the basis of the first direction scan offset using the at least one correction data set to provide a second corrected position.

3. The method of claim 1, wherein the at least one correction data set comprises at least one correction map.

4. The method of claim 1, wherein the at least one correction data set comprises a first correction map for correcting the first position on the basis of the second direction scan offset and a second correction map for correcting the second position on the basis of the first direction scan offset.

5. The method of claim 1, wherein the at least one correction data set comprises a two-dimensional correction map for correcting at least one of the first and second positions on the basis of the first direction scan offset and the second direction scan offset.

6. The method of claim 1, wherein the first direction is perpendicular to the second direction.

7. The method of claim 1, wherein the measuring the alignment mark comprises scanning the alignment mark in a scanning direction, the scanning direction having a non-zero component in the first direction and a non-zero component in the second direction.

8. The method claim 1, wherein the measuring the alignment mark comprises scanning in a first measurement scan the alignment mark in a first scanning direction parallel to the first direction and scanning in a second measurement scan the alignment mark in a second scanning direction parallel to the second direction.

9. The method of claim 1, wherein the alignment mark comprises overlapping grid features in the first direction and the second direction.

10. The method of claim 1, wherein the alignment mark is an alignment mark having an internal structure having subareas with different grid line features extending in at least two directions.

11. The method of claim 1, wherein the alignment mark assembly comprises a first alignment mark having grid lines extending in the first direction and a second alignment mark having grid lines extending in the second direction, the first alignment mark and the second alignment mark being adjacent to each other.

12. The method of claim 1, wherein the alignment mark or alignment mark assembly is an intra-field alignment mark or an intra-field alignment mark assembly.

13. The method of claim 1, wherein the at least one correction data set is obtained by calibration measurements of the alignment mark or the alignment mark assembly.

14. The method of claim 13, wherein the calibration measurements are performed to correct for effects of surrounding structures of the alignment mark or the alignment mark assembly.

15. The method of claim 13, wherein the calibration measurements are performed to correct for effects of internal structures of the alignment mark or the alignment mark assembly.

16. The method of claim 13, wherein the calibration measurements are performed to correct for effects of intensity profiles of a measurement beam.

17. The method of claim 1, further comprising correcting the first corrected position on the basis of the second corrected position to provide a first further corrected position and correcting a second corrected position on the basis of the first corrected position to provide a second further corrected position using at least one correction data set.

18. An alignment system comprising:
an alignment sensor system configured to measure an alignment mark or alignment mark assembly using an expected location of the alignment mark or alignment mark assembly, and
a processing unit configured to:
determine a first position of the alignment mark or alignment mark assembly in a first direction,
determine a second position of the alignment mark or alignment mark assembly in a second direction,
determine a second direction scan offset between the expected location of the alignment mark or alignment mark assembly in the second direction and the determined second position, and
correct the first position on the basis of the second direction scan offset using at least one correction data set to provide a first corrected position.

19. The alignment system of claim 18, wherein the processing unit is configured to:
determine a first direction scan offset between the expected location of the alignment mark or alignment mark assembly in the first direction and the determined first position, and
correct the second position on the basis of the first direction scan offset using at least one correction data set to provide a second corrected position.

20. The alignment system of claim 18, wherein:
the alignment sensor system provides a measurement beam having a spot size on the alignment mark or alignment mark assembly, and
the spot size of the measurement beam is larger than a smallest cross dimension of the alignment mark or a smallest cross dimension of an alignment mark of the alignment mark assembly.

21. A lithographic tool comprising:
an alignment system to measure an alignment mark or an alignment mark assembly, the alignment system comprising:
an alignment sensor system configured to measure the alignment mark or alignment mark assembly using an expected location of the alignment mark or alignment mark assembly, and
a processing unit configured to:
determine a first position of the alignment mark or alignment mark assembly in a first direction,
determine a second position of the alignment mark or alignment mark assembly in a second direction,
determine a second direction scan offset between the expected location of the alignment mark or alignment mark assembly in the second direction and the determined second position, and
correct the first position on the basis of the second direction scan offset using at least one correction data set to provide a first corrected position.

* * * * *